United States Patent [19]
Ahn

[11] Patent Number: 6,002,625
[45] Date of Patent: Dec. 14, 1999

[54] CELL ARRAY AND SENSE AMPLIFIER STRUCTURE EXHIBITING IMPROVED NOISE CHARACTERISTIC AND REDUCED SIZE

[75] Inventor: Jin-Hong Ahn, Anyang, Rep. of Korea

[73] Assignee: LG Semicon Co., Ltd., Choongcheongbuk-do, Rep. of Korea

[21] Appl. No.: 08/991,618

[22] Filed: Dec. 16, 1997

[30] Foreign Application Priority Data

Dec. 30, 1996 [KR] Rep. of Korea ....................... 96-77508

[51] Int. Cl.⁶ ........................................................ G11C 7/02
[52] U.S. Cl. ............................................ 365/206; 365/207
[58] Field of Search .................................. 365/206, 207, 365/203, 230.03, 230.06, 63, 51, 214

[56] References Cited

U.S. PATENT DOCUMENTS

| | | | |
|---|---|---|---|
| 5,134,588 | 7/1992 | Kubota et al. ........................... | 365/207 |
| 5,418,750 | 5/1995 | Shiratake et al. ....................... | 365/206 |
| 5,586,078 | 12/1996 | Takase et al. ....................... | 365/230.03 |
| 5,732,010 | 3/1998 | Takashima et al. ..................... | 365/207 |

*Primary Examiner*—David Nelms
*Assistant Examiner*—David Lam

[57] ABSTRACT

An improved cell array and sense amplifier structure and embodied method are disclosed. The structure exhibits an improved noise characteristic by decreasing a coupling noise which occurs between bit lines by using, as a reference bit line, a bit line from an array of memory cells other than the array to which the bit line belongs, thus forming a predetermined spacing between a bit line and a reference bit line. The structure includes: an upper sense amplifier having an input terminal commonly connected with a first pair of bit lines of an adjacent first cell array and another input terminal commonly connected with a first pair of bit lines of a non-adjacent second cell array; and a lower sense amplifier having an input terminal commonly connected with a second pair of bit lines of the second cell array and another input terminal connected with a second pair of bit lines of the first cell array.

26 Claims, 7 Drawing Sheets

CELL ARRAY AND SENSE AMPLIFIER STRUCTURE EXHIBITING IMPROVED NOISE CHARACTERISTIC AND REDUCED SIZE

FIELD OF THE INVENTION

The present invention relates to a memory cell array and sense amplifier structure for a semiconductor memory device exhibiting an improved noise characteristic and in particular to an improved memory cell array and sense amplifier structure which reduces a capacitance of a bit line during a sensing operation and blocks a coupling noise which occurs due to a coupling between neighboring bit lines.

BACKGROUND OF THE INVENTION

FIG. 1 is a schematic circuit diagram illustrating a conventional memory cell array and sense amplifier structure of a semiconductor memory device.

As shown therein, cell arrays CA0 through CAn each include a folded bit line structure in which memory cells are arranged at the intersections between every other one of word lines WL0 through WLn and bit lines BL1, /BL1, . . . , BLn, /BLn.

Odd pairs of bit lines BL and /BL are connected to multiple sense amplifiers SA arranged in a circuit unit above the cell array CA0, through block selection switches 3 and 4. The bit lines BL and /BL are also connected, through bit line pre-charge switches 1 and 2 with a pre-charge voltage VBLP line and a supply unit (not shown).

Even pairs of bit lines BL and /BL are connected with corresponding sense amplifiers SA arranged in a circuit below the cell array CA0, through block selection switches 3 and 4. The bit lines are connected to a pre-charge voltage supply unit (not shown) by pre-charge line VBLP through bit line pre-charge switches 1 and 2. The gates of the switches 1 and 2 are connected to a pre-charge control line BA.

The neighboring cell arrays CA include common sense amplifiers SA, i.e., there is an array of sense amplifiers between each pair of cell arrays. The above-described cell arrays CA are connected in a multiple cell structure, for thus forming multiple cell arrays.

FIG. 2 is a schematic detailed circuit diagram illustrating a sense amplifier circuit as shown in the circuit of FIG. 1.

As shown therein, there are provided a PMOS transistor PM1, a first NMOS transistor NM1 and a second NMOS transistor NM2 which are connected in series between a voltage Vcc and a ground voltage Vss. The source of the transistor PM1 is connected to Vcc and the drain is connected to both the signal line SPC and the source of the transistor NM1. The drain of the transistor NM1 is connected to signal line SNC and the source of the transistor NM2. The drain of the transistor NM2 is connected to ground. The gate of the PMOS transistor PM1 is connected to the signal SPE. The gate of NMOS transistor NM2 is connected to signal line SNE. The gate of transistor NM1 is connected to signal line SAEQ. For NMOS transistors NM1 and NM2, a plurality of sense amplifiers SA are connected in parallel between the common drain SPC of the PMOS transistor PM1 and the common drain SNC of the NMOS transistor NM2.

The operation of the conventional cell array and sense amplifier structure will now be explained with reference to FIGS. 1 through 3H.

First, the block selection switches 3 and 4 are turned on by a high level block selection signal BS0 as shown in FIG. 3C. The occasion that the cell array CA0 is selected will now be explained.

When a row address strobe signal /RAS (which activates the DRAM) is a low level (as shown in FIG. 3A), a corresponding word line WL0 becomes high level (as shown in FIG. 3B), so that the data from the memory cells connected with the word line WL0 are carried on the bit line connected with the memory cells.

The bit line pre-charge switches 1 and 2 are turned off by a low level bit line pre-charge signal BPO (as shown in FIG. 3D), so that the bit lines carrying the data from the accessed memory cells are not pre-charged.

Therefore, the data carried on the bit lines are inputted into the sense amplifiers SA connected in the circuit units arranged above and below the cell array CA0 through the block selection switches 3 and 4.

As shown in FIGS. 3E and 3F, if the sense amplifier PMOS transistor enabling signal SPE and the sense amplifier equalizing signal SAEQ are both at the low level, and the sense amplifier NMOS transistor enabling signal SNE is at the high level, the PMOS transistor PM1 and the NMOS transistor NM2 of the sense amplifier controller are turned on, and the NMOS transistor NM1 is turned off, so that the P side drain line SPC, as shown in FIG. 3G, becomes the high level (Vcc), and the N side drain line SNC becomes the low level (Vss).

Therefore, the sense amplifiers SA connected in the circuit units arranged above and below the cell arrays SA0, as shown in FIG. 3H, are activated, and the sensing operation of the data carried on the bit lines is performed.

If the signal /RAS becomes a high level, the word line WL becomes low level, for thus blocking the output of the cell data, and the bit line pre-charge switches 1 and 2 are turned on by a high level bit line pre-charge signal BPO, so that the bit lines are pre-charged to a bit line pre-charge voltage VBLP.

In addition, if the sense amplifier PMOS transistor enabling signal SPE and the sense amplifier equalizing signal SAEQ are both at a high level, and the sense amplifier NMOS transistor enabling signal SNE is at a low level, the NMOS transistor NM1 is turned on, so that the drain lines SPC and SNC, as shown in FIG. 3G, are equalized to the bit line pre-charge voltage VBLP.

However, in the conventional cell array and sense amplifier, since the bit line pairs of the bit line BL and the bit line /BL neighbor each other, coupling noise may easily occur therebetween.

Namely, if the word line WL is at the high level, the charges from the activated cells move along the bit line BL. At this time, if the neighboring reference bit lines /BL are influenced by the coupling capacitance, the voltage difference between the bit lines BL and the bit lines /BL is decreased, so that tolerance of noise is reduced during data sensing, i.e., sensitivity to noise increases.

In addition, as the data storage capacity of the DRAM is increased, and as the spacing between the bit lines is decreased, the above-described problems become more exaggerated.

SUMMARY OF THE INVENTION

Accordingly, it is an object of the present invention to provide a cell array and sense amplifier structure which exhibits an improved noise characteristic which overcomes the aforementioned problems encountered in the conventional art.

It is another object of the present invention to provide an improved cell array and sense amplifier structure that achieves the improved noise characteristic by reducing a capacitance of a bit line during a sensing operation and significantly reducing a coupling noise which occurs due to a coupling between neighboring bit lines.

It is another object of the present invention to provide an improved cell array and sense amplifier structure that exhibits the reduced noise characteristic by using, as a reference bit line, a bit line from an array of memory cells other than the array to which the bit line belongs, thus forming a predetermined spacing between a bit line and a reference bit line.

To achieve the above objects, in accordance with a first embodiment of the present invention, there is provided a cell array and sense amplifier structure exhibiting a reduced sensitivity to noise, the structure including: sense amplifiers of a first one of the circuit units each having an input terminal thereof connected with a corresponding first pair of bit lines of an adjacent first one of the memory cell arrays and having another input terminal commonly connected with a first pair of bit lines of a non-adjacent second one of the memory cell arrays, and sense amplifiers of a second one of the circuit units having an input terminal thereof commonly connected with a corresponding second pair of bit lines of the second memory cell array and having another input terminal thereof connected with a corresponding second pair of bit lines of the first cell array.

To achieve the above objects, in accordance with a second embodiment of the present invention, there is provided a cell array and sense amplifier structure capable of improving a noise characteristic, which includes sense amplifiers of a first one of the circuit unit each having an input terminal thereof connected with a first bit line of an adjacent first one of the cell arrays and another input terminal thereof connected with a first bit line of a non-adjacent second one of the cell arrays, and sense amplifiers of a second one of the circuit units each having an input terminal thereof connected with a second bit line of the first cell array and another input terminal thereof connected with a second bit line of the second cell array.

These and other objects of the present invention are also fulfilled by providing a method of sensing, with a sense amplifier, a datum in a memory cell within an array of memory cells in a memory device, the method comprising the steps of: selectively connecting a bit line from a first-given array of memory cells to a first input of said sense amplifier; and selectively connecting, as a reference bit line, a bit line from a second-given array of memory cells to a second input of said sense amplifier.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENT

Figure 1:
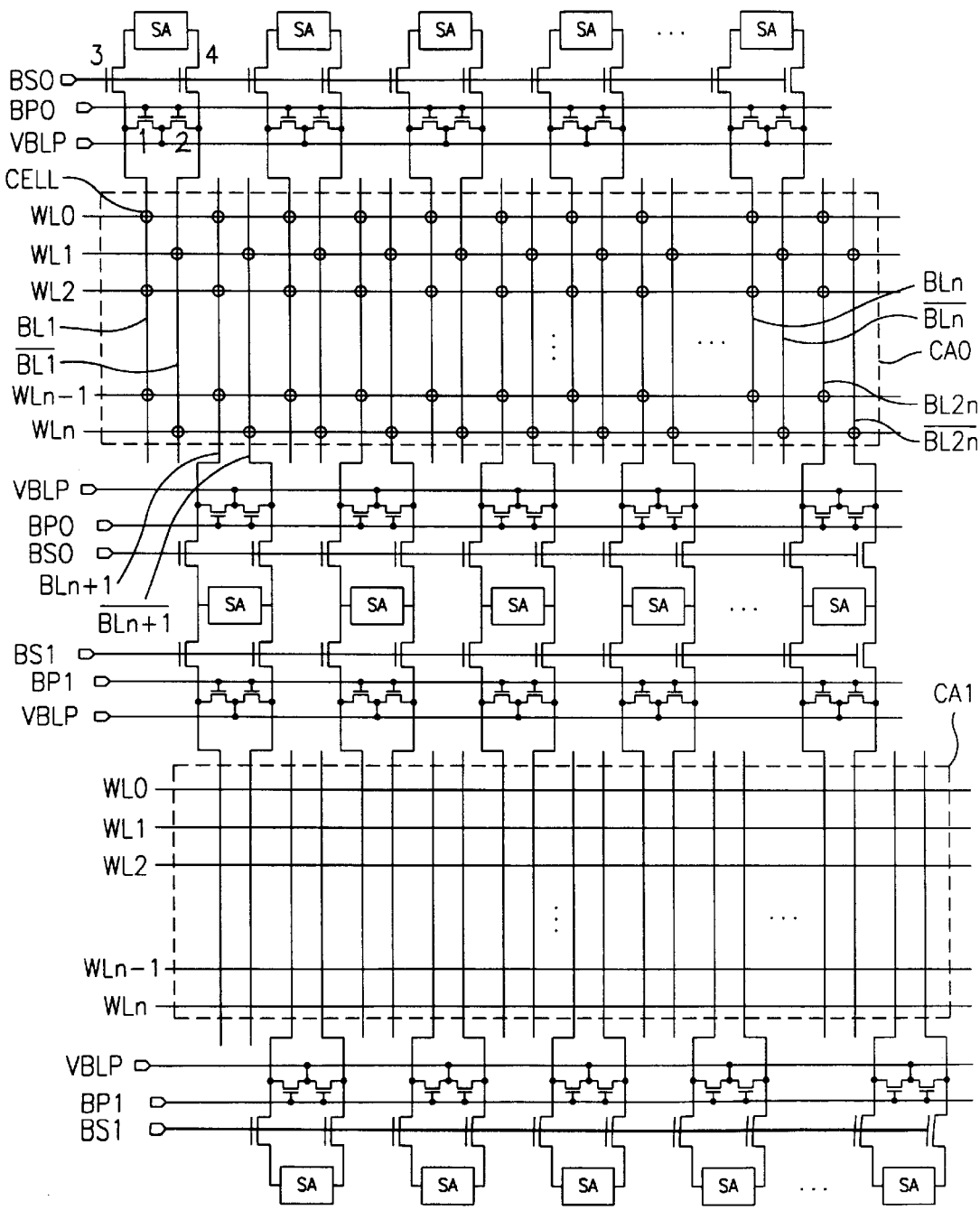
FIG. 1 is a schematic circuit diagram illustrating a conventional cell array and sense amplifier structure.
Figure 2:
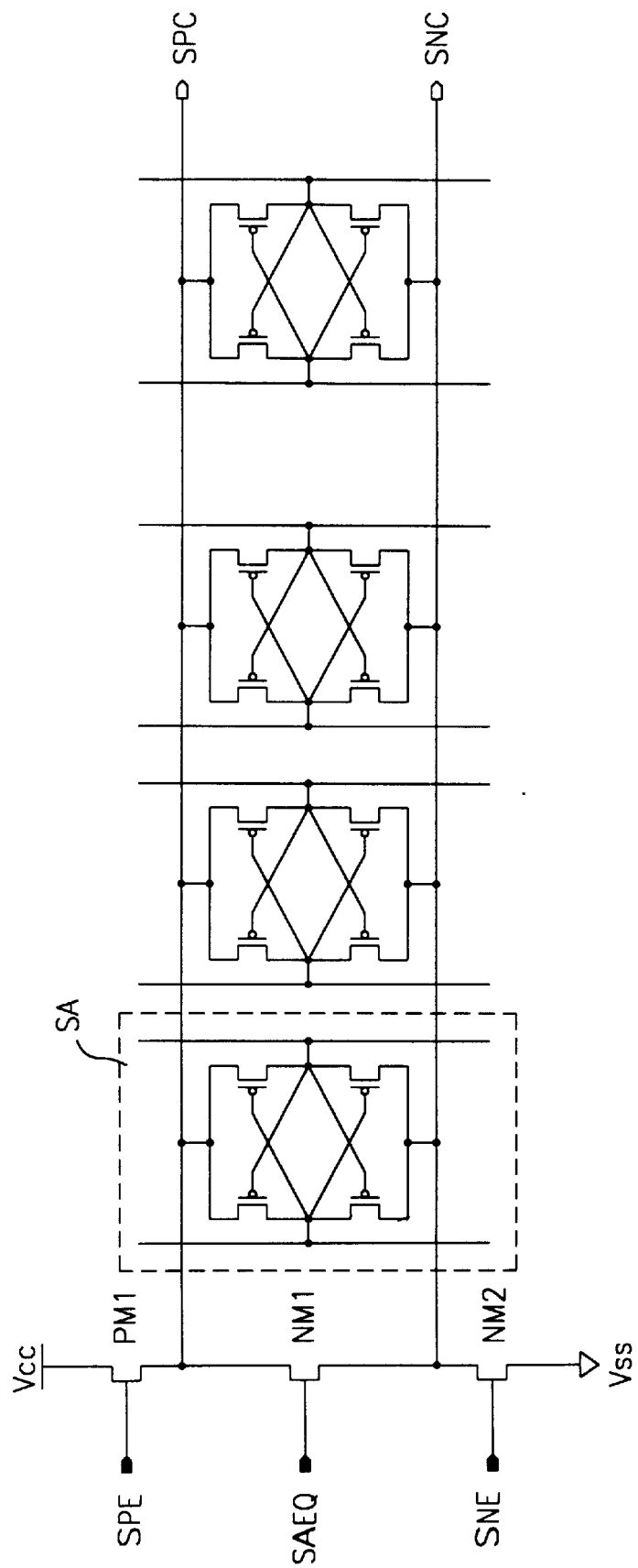
FIG. 2 is a detailed schematic circuit diagram illustrating a sense amplifier as shown in FIG. 1.
Figure 3:
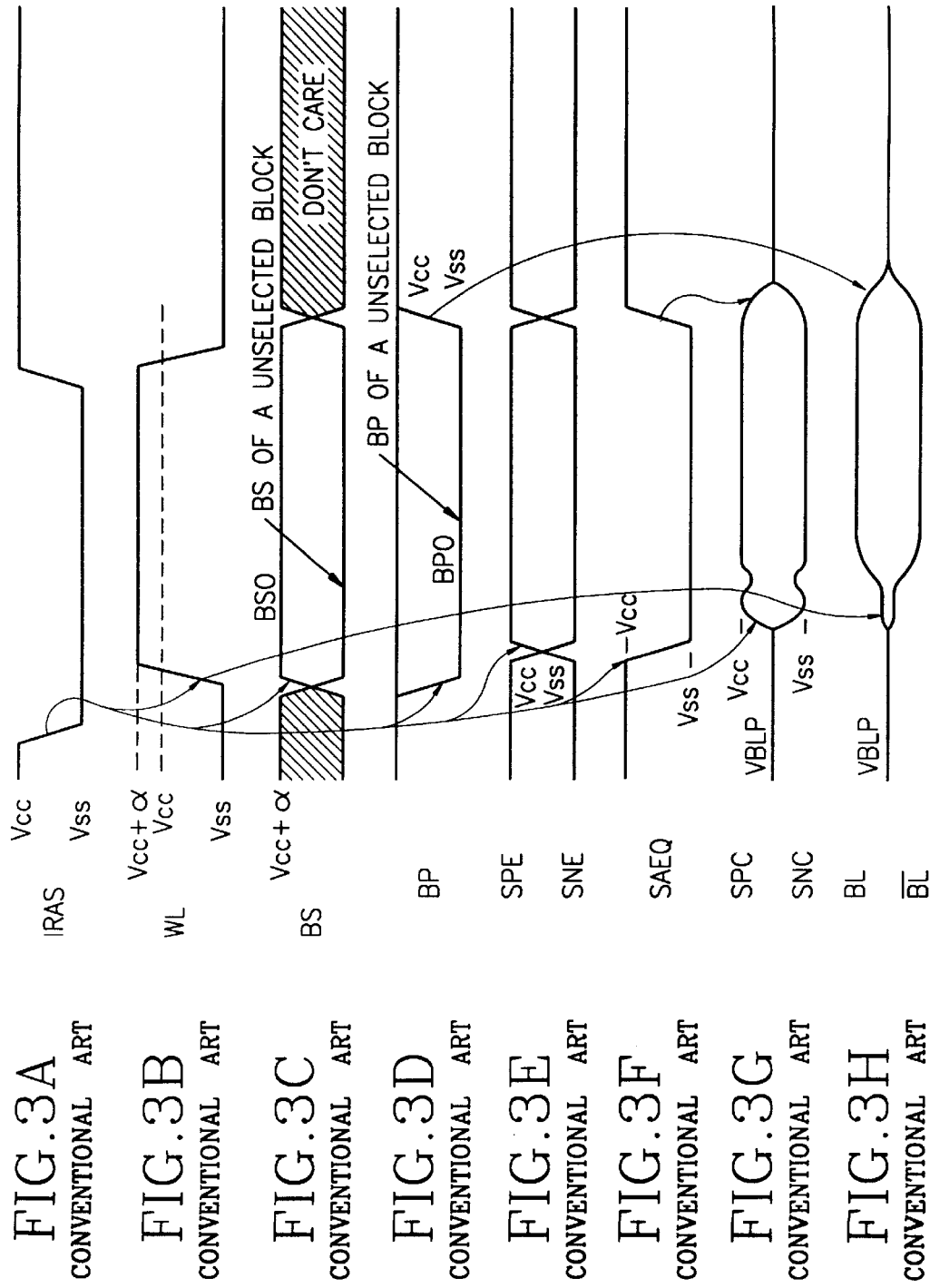
FIGS. 3A through 3H are timing waveforms of signals in each element of the circuit as shown in FIG. 1.
Figure 4:
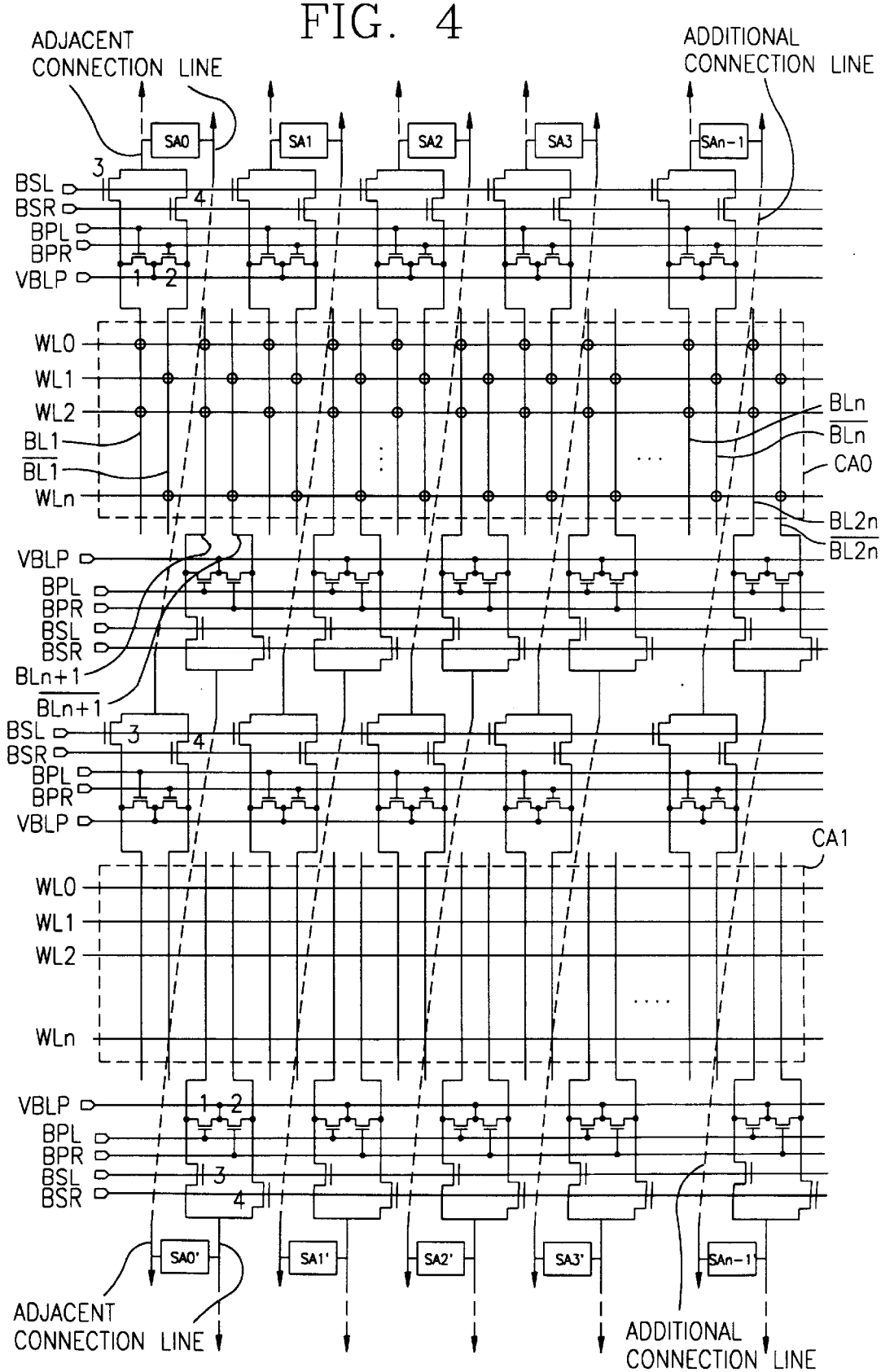
FIG. 4 is a diagram illustrating a cell array and sense amplifier structure according to the present invention.

FIG. 4 is a schematic circuit diagram illustrating a cell array and sense amplifier structure according to the present invention, which is capable of improving a noise characteristic.

As shown therein, the cell array and sense amplifier structure according to the present invention includes a folded bit line structure. Namely, in cell arrays CA0 through CAn, cells are located alternately at intersections of word lines WL0 through WLn and pairs of bit lines BL1, /BL1, . . . , BLn, /BLn.

In addition, the odd bit lines BL and /BL of the cell array CA0 are selectively connectable through block selection switches 3 and 4, respectively, of a circuit unit arranged above the cell array CA0 to one input terminal of the sense amplifier SA0. Also, the odd bit lines BL and /BL of the next cell array CA1 are selectively connectable through the block selection switches 3 and 4, respectively, of a circuit unit arranged above the cell array CA1 to another input terminal of the sense amplifier SA0 through an additional connection line.

The even bit lines BL and /BL of the cell array are selectively connectable through the block selection switches 3 and 4, respectively, of a circuit unit arranged below the cell array CA0 and act as an input terminal of the sense amplifier SA0' of the circuit unit arranged below the cell array CA1 connected through an additional connection line. The even bit lines BL and /BL of the cell array CA1 are selectively connectable through the block selection switches 3 and 4, respectively, of the circuit unit arranged below the cell array CA1 and act as another input terminal of the sense amplifier SA0'.

To the gates of the bit line pre-charge switches 1 and 2, a left bit line pre-charge signal BPL and a right bit line pre-charge signal BPR are inputted, respectively. To the gates of the block selection switches 3 and 4, a block selection left signal BSL and a block selection right signal BSR are inputted, respectively.

In addition, a sense amplifier SA is disposed immediately adjacent to only one side of each of the cell arrays CA0 through CAn-1. Only the block selection switches 3 and 4 and the bit line pre-charge switches 1 and 2 are disposed immediately adjacent to the other side of the cell arrays CA0 through CAn-1. Therefore, the sense amplifiers SA are only provided at every second cell array CA.

The sensing method of the cell array and sense amplifier structure according to the present invention will now be explained.

First, in the case that a first word line WL0 of the first cell array CA0 is selected, the sensing operation will now be explained.

When the signal /RAS, as shown in FIG. 5A, is enabled to a low level, the word line WL0, as shown in FIG. 5B, becomes high level, for thus accessing the cells connected to the word line WL0.

Since the cell arrays CA0 through CAn have a folded bit line structure in which half of the cells are connected (at the intersections of each alternate word lines WL0 through WLn and the bit lines BL1 and /BL1), the bit lines BL1, ..., BLn (which are activated and output the cell data) are switched.

As shown in FIG. 5C, if the left block selection signal BSL which is inputted to the block selection switch 3 (of the circuit units arranged above and below the cell array CA0) is at a high level, and the right block selection signal BSR inputted to the block selection switches 4 is at a low level, the bit line BL connected to the activated cell is connected to the sense amplifier SA0.

In the block in which word lines WL are not selected, the left block selection signal BSL and the right block selection signal BSR all become low level.

In addition, a low level left bit line pre-charge (BPL) signal and a high level right bit line pre-charge (BPR) signal, as shown in FIG. 5D, are inputted to the bit line pre-charge switches 1 and 2, so that the bit lines carrying data from the memory cells are not pre-charged. At this time, the bit line pre-charge left (BPL) signal and the bit line pre-charge right (BPR) signal of the block which was not selected become high level.

As shown in FIGS. 5E and 5F, if the sense amplifier PMOS transistor enabling signal SPE and the sense amplifier equalizing signal SAEQ are both at the low level and the sense amplifier NMOS transistor enabling signal SNE is at the high level, the PMOS transistors PM1 and the NMOS transistors NM2 of the controllers of the sense amplifiers SA0, ..., SAn-1 and the sense amplifiers SA0', ..., SAn-1' are turned on and the NMOS transistors NM1 are turned off, respectively. The drain line SPC, as shown in FIG. 5G, becomes the high level, and the drain line SNC becomes the low level, for thus operating the sense amplifier SA.

Therefore, the sense amplifiers SA0, ..., SAn-1 of the circuit unit arranged above the cell array CA0 receive the data from the line of the odd pairs of bit lines of the array CA0 through an input terminal of the sense amplifiers and receive the data from the line of the odd pairs of the bit lines from the cell array CA1, for thus performing the sensing operation as shown in FIG. 5H.

The sense amplifiers SA0', ..., SAn-1' of the circuit unit arranged below the cell array CA1 receive the data from the even bit line pairs of the cell array CA0 through one of their input terminals and receive the data from the even bit line pairs of the cell array CA1, through their other input terminal, respectively, for thus performing the sensing operation as shown in FIG. 5H.

In this case, the bit line capacitances seen by the sense amplifiers SA0, ..., SAn-1 and SA0', ..., SAn-1' become identical because the lines connected to the sense amplifier input terminals are of substantially the same length.

Since the capacitances seen are always of one common bit line and one non-neighboring additional connection line from another cell array, it is possible to increase the noise margin during a sensing operation. In addition, the non-connected line of a bit line pair acts like an insulator between the connected bit line and the line going to the other terminal of the sense amplifier. This is because the non-connected bit line is not pre-charged, in contrast to the connected bit line which is.

Figure 6:
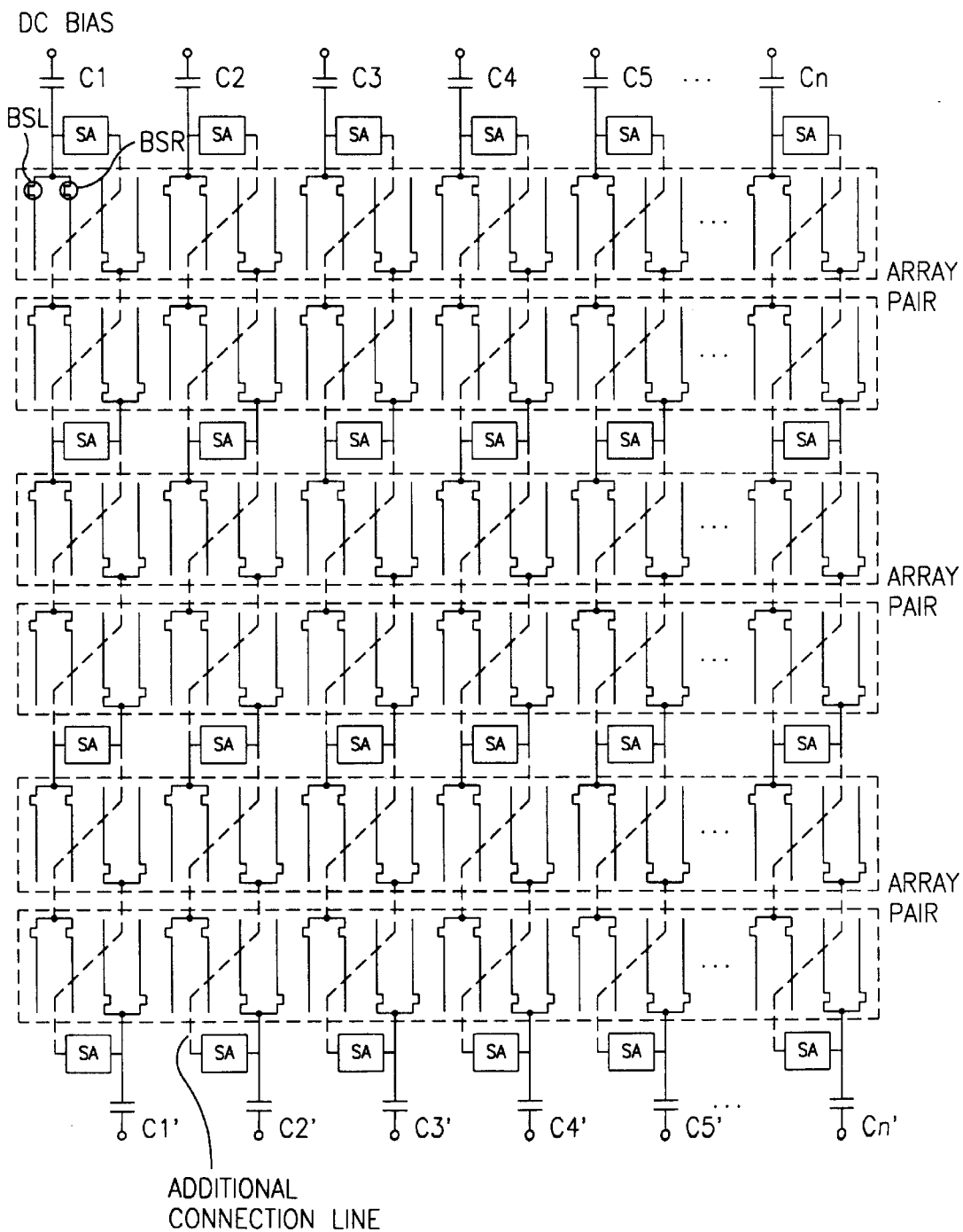
FIG. 6 is a schematic circuit diagram illustrating multiple cell arrays according to the present invention.

In addition, as shown in FIG. 6, the cell array structure is extended. The sense amplifiers SA are located between two cell array pairs, each pair having two cell arrays. The sense amplifiers SA provided in the outermost margins of the cell arrays have an additional connection line connected at one side thereof and a common bit line connected at another side thereof. Therefore, as shown in FIG. 6, a balance in the bit line capacitances of the outermost cell arrays can be maintained by connecting matching capacitances C1 through Cn and C1' through Cn' or by extending the common bit lines.

Figure 5:
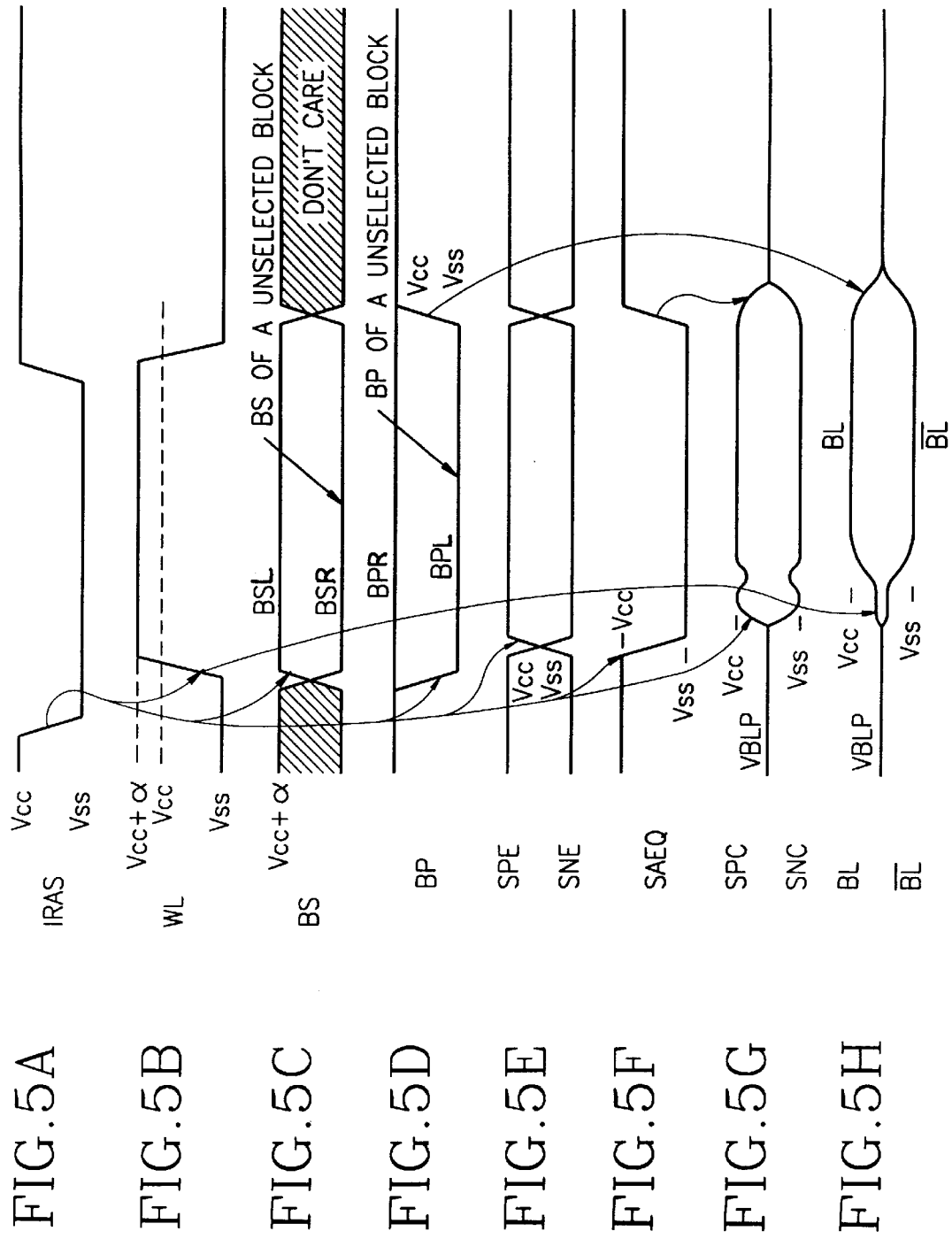
FIGS. 5A through 5H are timing waveforms of signals in each element of the circuit as shown in FIG. 4.
Figure 7:
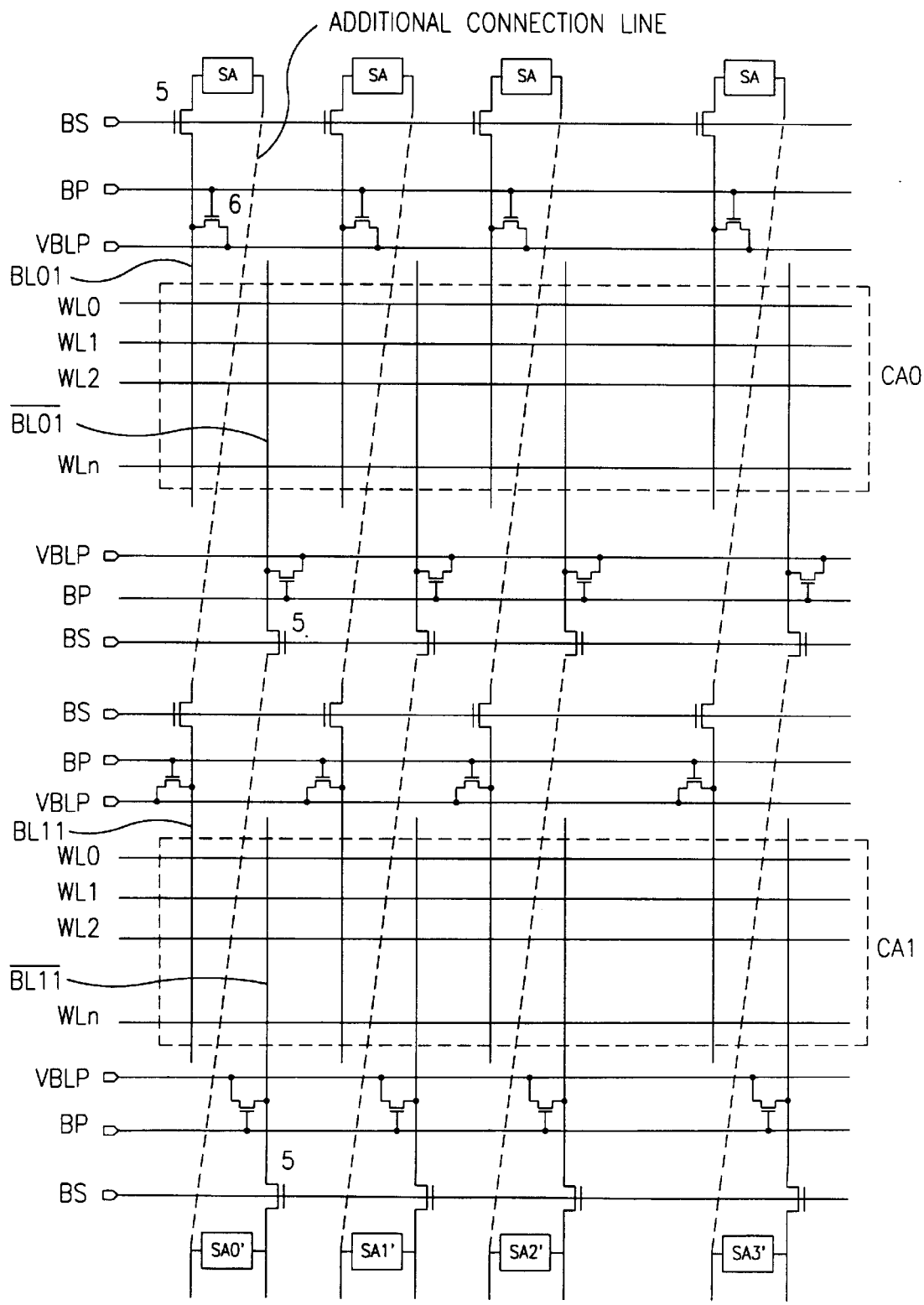
FIG. 7 is a schematic circuit diagram illustrating multiple arrays according to another embodiment of the present invention.

FIG. 7 is a schematic circuit diagram illustrating multiple cell arrays according to another embodiment of the present invention. As shown therein, differently from the structure of the folded bit lines as shown in FIG. 5, the multiple cell arrays according to this embodiment of the present invention include an open bit line structure. On all bit lines BL and /BL and word lines WL, cells are connected at every intersection between the bit lines BL and /BL and the word lines WL, respectively.

For example, in FIG. 7, the bit line BL01 of the cell array CA0 is connected to one input terminal of the sense amplifier SA0 (through a block selection switch 5) arranged above the cell array CA0. The bit line BL11 of the cell array CA1 (extending below the sense amplifier SA0 and into the array CA0) is connected to the other input terminal of the sense amplifier SA0 (through the block selection switch 5) and through an additional connection line.

Continuing the example from FIG. 7, the bit line /BL01 of the cell array CA0 connects to an input terminal of the sense amplifier SA0' (arranged below the cell array CA1) through the block selection switch 5 (arranged below the cell array CA0). The bit line /BL11 of the cell array CA1 connects to the other input terminal of the sense amplifier SA0' through the block selection switch 5 (arranged below the cell array CA1).

Instead of the bit line pre-charge left signal BPL and the bit line pre-charge right signal BPR of FIG. 4, one bit line pre-charge signal BP is used in FIG. 7. Instead of the left block selection signal BSL and the right block selection signal BSR of FIG. 4, one block selection signal BS is used in FIG. 7.

In contrast to FIG. 4, wherein a sense amplifier is allotted to every four bit lines each sense amplifiers in FIG. 7 is allotted to every two bit lines.

The bit line pre-charge signal BP is inputted to the gates of the MOS transistors 6 connected to the bit lines BL and /BL before the block selection switches 5 are turned on by the bit selection line BSL. The bit line pre-charge voltage VBLP is inputted to the drain of each transistor 6 and the source of each transistor 6 is connected to a bit line BL, or /BL, respectively.

Since the operation of this embodiment is the same as for the previous embodiment as shown in FIGS. 5A through 5H, description thereon will be omitted.

As described above, the cell array and sense amplifier structure of the present invention exhibit an improved noise characteristic since the bit line BL and the reference bit line /BL are not adjacent. That is, the bit line BL is selected from one cell array and the reference bit line /BL is selected from another cell array. Also, the neighboring bit line is not raised to a pre-charge level, so the coupling capacitance effect is decreased, thus preventing the coupling noise.

In addition, since the capacitance of the bit line connected to the cells is about five times the capacitance of the additional connection line, the bit line capacitance seen by the sense amplifier connected to the additional connection line is decreased, thus decreasing the power consumption at the time when the DRAM is activated, and increasing the noise margin (the amount by which the signal exceeds a noise level) during the sensing operation.

Moreover, if the cell array and sense amplifier structure according to the present invention is adapted to an open bit line structure, the number of cells connected to one sense amplifier is advantageously decreased by half.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A cell array and sense amplifier structure for a semiconductor memory device exhibiting a reduced sensitivity to noise, the structure comprising:

a plurality of sense amplifiers arranged in circuit units above and below a pair of arrays of memory cells, said pair of arrays of memory cells having a folded bit line structure in which one half of such memory cells of each array are connected at intersections of word lines and bit lines associated with a corresponding one or the other of the circuit units;

sense amplifiers of a first one of said circuit units each having an input terminal thereof selectively connectable with a corresponding first pair of bit lines, respectively, of a first one of said memory cell arrays adjacent to the sense amplifiers of the first one of said circuit units and having another input terminal selectively connectable with a first pair of bit lines, respectively, of a second one of said memory cell arrays non-adjacent to the sense amplifiers of the first one of said circuit units; and sense amplifiers of a second one of said circuit units having an input terminal thereof selectively connectable with a corresponding second pair of bit lines, respectively, of said second one of said memory cell arrays and having another input terminal thereof selectively connectable with a corresponding second pair of bit lines, respectively, of said first one of said memory cell arrays.

2. The structure of claim 1, wherein the another input terminal of each sense amplifier is selectively connectable to the corresponding pair of bit lines by an additional connection line extending from a non-adjacent memory cell array.

3. The structure of claim 1, wherein said circuit units of sense amplifiers are disposed at every second memory cell array.

4. The structure of claim 1, wherein each of the bit lines is selectively connectable to an input of a sense amplifier by a block selection switch.

5. The structure of claim 1, wherein each sense amplifier provided in an outermost margin of the semiconductor memory device has a matching capacitor connected to the input terminal thereof which is commonly connected to the corresponding pair of the bit lines.

6. The structure of claim 5, wherein a block selection switch is connected between each of the bit lines and a corresponding sense amplifier.

7. The structure of claim 1, wherein the sense amplifiers are not arranged between the first one and the second one of said memory cell arrays of said pair of arrays of memory cells.

8. A cell array and sense amplifier structure for a semiconductor memory device exhibiting a reduced sensitivity to noise, the structure comprising:

a plurality of sense amplifiers arranged in circuit units above and below a pair of arrays of memory cells, said pair of arrays of memory cells each having an open bit structure in which memory cells are connected at all intersections of word lines and bit lines;

sense amplifiers of a first one of said circuit units each having an input terminal thereof selectively connectable with a first bit line of a first one of said memory cell arrays adjacent to the sense amplifier of the first one of said circuit units and having another input terminal thereof connected with a first bit line of a second one of said memory cell arrays non-adjacent to the sense amplifiers of the first one of said circuit units; and sense amplifiers of a second one of said circuit units each having an input terminal thereof connected with a second bit line of said first one of said memory cell arrays and another input terminal thereof connected with a second bit line of said second one of said memory cell arrays.

9. The structure of claim 8, wherein said sense amplifiers are provided at every two bit lines.

10. The structure of claim 8, wherein the sense amplifiers are not arranged between the first one and the second one of said memory cell arrays of said pair of arrays of memory cells.

11. A semiconductor memory structure comprising:

a plurality of memory blocks; and a plurality of arrays of sense amplifiers for sensing and amplifying data in said plurality of memory blocks, respectively, each of said memory blocks including an array of memory cells;

a plurality of bit lines selectively connectable to said memory cells;

a first sense amplifier interface having a first plurality of controllable switches arranged on a first side of said array of memory cells, said first plurality of controllable switches being for selectively conditioning a first set of said bit lines and for selectively connecting said first set to said sense amplifiers; and a second sense amplifier interface having a second plurality of controllable switches arranged on a second side of said array of memory cells, said second plurality of controllable switches being for selectively conditioning a second set of said bit lines and for selectively connecting said second set to said sense amplifiers;

wherein, for each of said memory blocks a first side of a first memory block is arranged adjacent to a second of said memory blocks such that a first sense amplifier interface of said first memory block is adjacent to one of said sense amplifier interfaces of said second memory block, a second side of said first memory block is arranged adjacent to a first of said arrays of sense amplifiers such that said second sense amplifier interface of said first memory block is adjacent, and selectively connectable, to said first sense amplifier array, and said first sense amplifier interface of said first memory block is selectively connectable to a second of said arrays of sense amplifiers, said second sense amplifier array being located on an opposite side, relative to said first memory block, of said second memory block such that not every pair of neighboring memory blocks has a sense amplifier array located therebetween.

12. The memory structure of claim 11, wherein the memory structure is a DRAM.

13. The memory structure of claim 11, wherein said first array of sense amplifiers is also connectable to said second memory block.

14. The memory structure of claim 11, wherein said first array of sense amplifiers is also connectable to a third memory block and a fourth memory block, said third memory block being located on a side of said first array of sense amplifiers opposite to a side on which is located said first memory block, and said fourth memory block being located on a side of said third memory block opposite to said side on which is located said first array of sense amplifiers.

15. The memory structure of claim 13, wherein each sense amplifier in said first array of sense amplifiers has a first and second input, said first input being selectively connectable to said second memory block and said third memory block according to the controllable switches, respectively, and said second input being selectively connectable to said first memory block and said fourth memory block according to the controllable switches, respectively.

16. The memory structure of claim 11, wherein each of said memory blocks is organized as pairs of adjacent bit lines, each pair of adjacent bit lines being selectively connectable, respectively, to an input of a sense amplifier in an array of sense amplifiers.

17. The memory structure of claim 16, wherein if a first bit line of a first pair of adjacent bit lines is connectable to a first sense amplifier in said first array of sense amplifiers, a second bit line of said first pair of adjacent bit lines acts as an insulator between said first bit line of said first pair of adjacent bit lines and a bit line of a second pair of adjacent bit lines from another memory block that is connectable to a second input of said first sense amplifier.

18. The memory structure of claim 17, wherein a first bit line of each pair of adjacent bit lines is connectable to an input of a sense amplifier in an array of sense amplifiers by a first controllable switch responsive to a signal on a first control line and a second bit line of each pair of adjacent bit lines is connectable to said input of said sense amplifier by a second controllable switch responsive to a signal on a second control line to thereby enable selective connection of either a first bit line of a pair of adjacent bit lines or a second bit line of said pair of adjacent bit lines to said input of said sense amplifier.

19. The memory structure of claim 17, wherein said second bit line of said first pair of adjacent bit lines acts as an insulator due to being precharged in a manner different than said first bit line of said first pair of adjacent bit lines.

20. The memory structure of claim 16, wherein each of said memory blocks is further organized such that even-numbered pairs of bit lines are connectable to an array of sense amplifiers on a first side of the memory block and odd-numbered pairs of bit lines are connectable to an array of sense amplifiers on a second side of the memory block.

21. The memory structure of claim 11, wherein said first sense amplifier interface of said first memory block is also selectively connectable to said first array of sense amplifiers.

22. The memory structure of claim 11, wherein each of said arrays of memory cells has a folded bit line structure.

23. The memory structure of claim 22, wherein each input terminal of a sense amplifier is selectively connectable to four bit lines.

24. The memory structure of claim 11, wherein each of said arrays of memory cells has an open bit line structure.

25. The memory structure of claim 24, wherein each input terminal of a sense amplifier is selectively connectable to two bit lines.

26. A method of sensing, with a sense amplifier, a datum in a memory cell within an array of memory cell pairs in a memory device, the method comprising the steps of:

selectively connecting a bit line from a first array of a memory cell pair to a first input of said sense amplifier; and selectively connecting, as a reference bit line, a bit line from a second array of the memory cell pair to a second input of said sense amplifier, the first array of the memory cell array being adjacent to the sense amplifier and the second array of the memory cell being non-adjacent to the sense amplifier, such that the sense amplifier is not located between the first and second arrays of the memory cell pair.

* * * * *